United States Patent [19]

Chow et al.

[11] Patent Number: 4,847,111
[45] Date of Patent: Jul. 11, 1989

[54] PLASMA-NITRIDATED SELF-ALIGNED TUNGSTEN SYSTEM FOR VLSI INTERCONNECTIONS

[75] Inventors: Yu C. Chow; Kuan-Yang Liao, both of Irvine; Maw-Rong Chin, Huntington Beach, all of Calif.

[73] Assignee: Hughes Aircraft Company, Los Angeles, Calif.

[21] Appl. No.: 213,861

[22] Filed: Jun. 30, 1988

[51] Int. Cl.$^4$ .............. B05D 3/06; B05D 5/12; H01L 21/00; H01L 21/306

[52] U.S. Cl. ................. 427/38; 156/653; 156/657; 156/662; 427/124; 427/255.4; 427/252; 437/41; 437/200

[58] Field of Search .............. 427/38, 39, 124, 255.4, 427/250, 252, 287, 294, 383.1, 399, 419.7; 156/643, 653, 657, 662; 437/41, 193, 200-245

[56] References Cited

U.S. PATENT DOCUMENTS 4,676,866 6/1987 Tang et al. ............... 437/200 X

Primary Examiner—William A. Powell
Attorney, Agent, or Firm—Terje Gudmestad; Kenneth W. Float; A. W. Karambelas

[57] ABSTRACT

A process for forming a diffusion barrier on exposed silicon and polysilicon contacts of an integrated circuit including the step of chemically vapor depositing a layer of tungsten in a self-aligned manner on the exposed contact areas. The layer of tungsten is plasma nitridated to form a tungsten nitride layer and to partially form a tungsten silicide layer adjacent the contact areas. The formation of the tungsten silicide layer is completed by thermal annealing.

13 Claims, 2 Drawing Sheets

PLASMA-NITRIDATED SELF-ALIGNED TUNGSTEN SYSTEM FOR VLSI INTERCONNECTIONS

BACKGROUND OF THE INVENTION

The disclosed invention generally relates to integrated circuit processing of silicon contacts, and is more particularly directed to a process for forming a multilayer, low resistance diffusion barrier on silicon contacts which requires only one annealing procedure and can be achieved in a chemical vapor deposition reactor without potentially contaminating and time consuming removal therefrom.

The integrated circuit processing industry has recognized the advantages of forming diffusion barriers of low resistivity on silicon contacts. This permits shallower diffusions, and further allows lowering of the sheet resistance of polysilicon gates. Further, aluminum spiking, the diffusion of the aluminum contact into the silicon under high current and/or high temperature conditions, is also prevented or significantly reduced.

Known techniques for forming diffusion barriers on silicon contacts include techniques for forming a stacked titanium nitride/titanium silicide layer, as specifically shown in U.S. Pat. No. 4,690,730, issued to Tang et al. on Sept. 1, 1987, and assigned to Texas Instruments Incorporated.

While the techniques disclosed in U.S. Pat. No. 4,690,730 achieve a diffusion barrier of low resistivity, important considerations include the following. The processing is not self-aligned, and moreover requires more than one annealing step. Further, the process does not allow nitridation and silicidation to be achieved in the same reactor without removal of the wafer in process for other intermediate processing.

SUMMARY OF THE INVENTION

It would therefore be an advantage to provide a self-aligned process for forming a diffusion barrier on silicon contacts.

Another advantage would be to provide a self-aligned a process for forming a diffusion barrier on silicon contacts which can be achieved in one reactor without removing the wafer therefrom.

The foregoing and other advantages and features are provided in the process of the invention for forming a diffusion barrier on exposed silicon and polysilicon contacts of an integrated circuit, said process including the steps of (a) chemically vapor depositing a layer of tungsten in a self-aligned manner on the exposed contact areas in a deposition reactor, (b) maintaining the wafer in the deposition reactor, and (c) transforming the deposited layer of tungsten to form tungsten nitride and tungsten silicide layers.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1A:
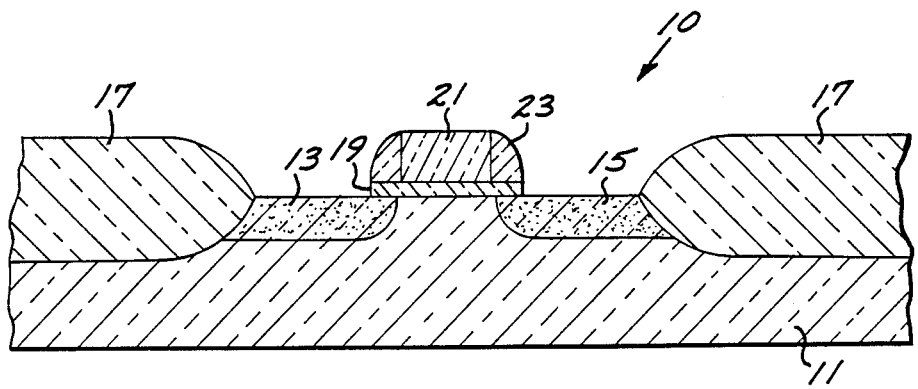
FIGS. 1A through 1C are schematic partial sectional views which are helpful in illustrating the process of the invention.

In the following detailed description and in the several figures of the drawing, like elements are identified with like reference numerals.

Referring now to FIG. 1A, shown therein is a portion of an integrated circuit wafer 10 which is undergoing processing, and which includes a silicon substrate 10 having source and drain regions 13, 15 formed therein. Field oxide regions 17 separate the source and drain regions 13, 15 from similar regions of other devices to be formed (not shown).

A gate oxide layer 19 is disposed on the top surface of the substrate 11 between the source and drain regions 13, 15, and a polysilicon gate 21 having smaller lateral dimensions is formed thereon. An oxide spacer 23 that is laterally coextensive with the gate oxide layer 19 surrounds the polysilicon gate 21.

The structure of the integrated circuit wafer 10 shown in FIG. 1A is made pursuant to known procedures, which can include growing gate oxide, depositing a blanket layer of polysilicon, masking and etching the polysilicon, depositing a low temperature oxide, etching the low temperature oxide to form the oxide spacer, implanting the source and drain regions, and annealing.

Figure 1B:
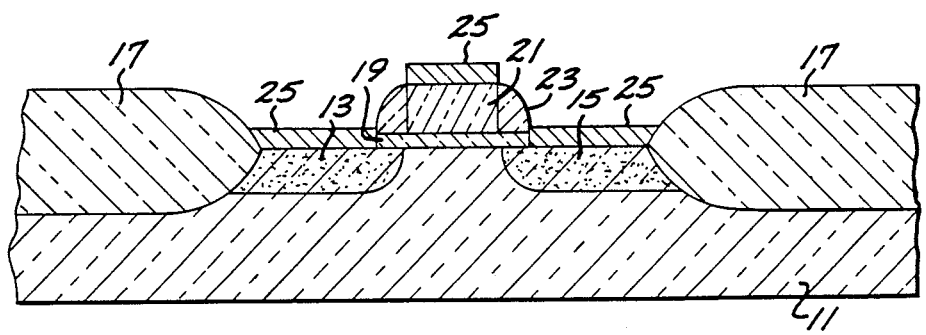
Figure 2:
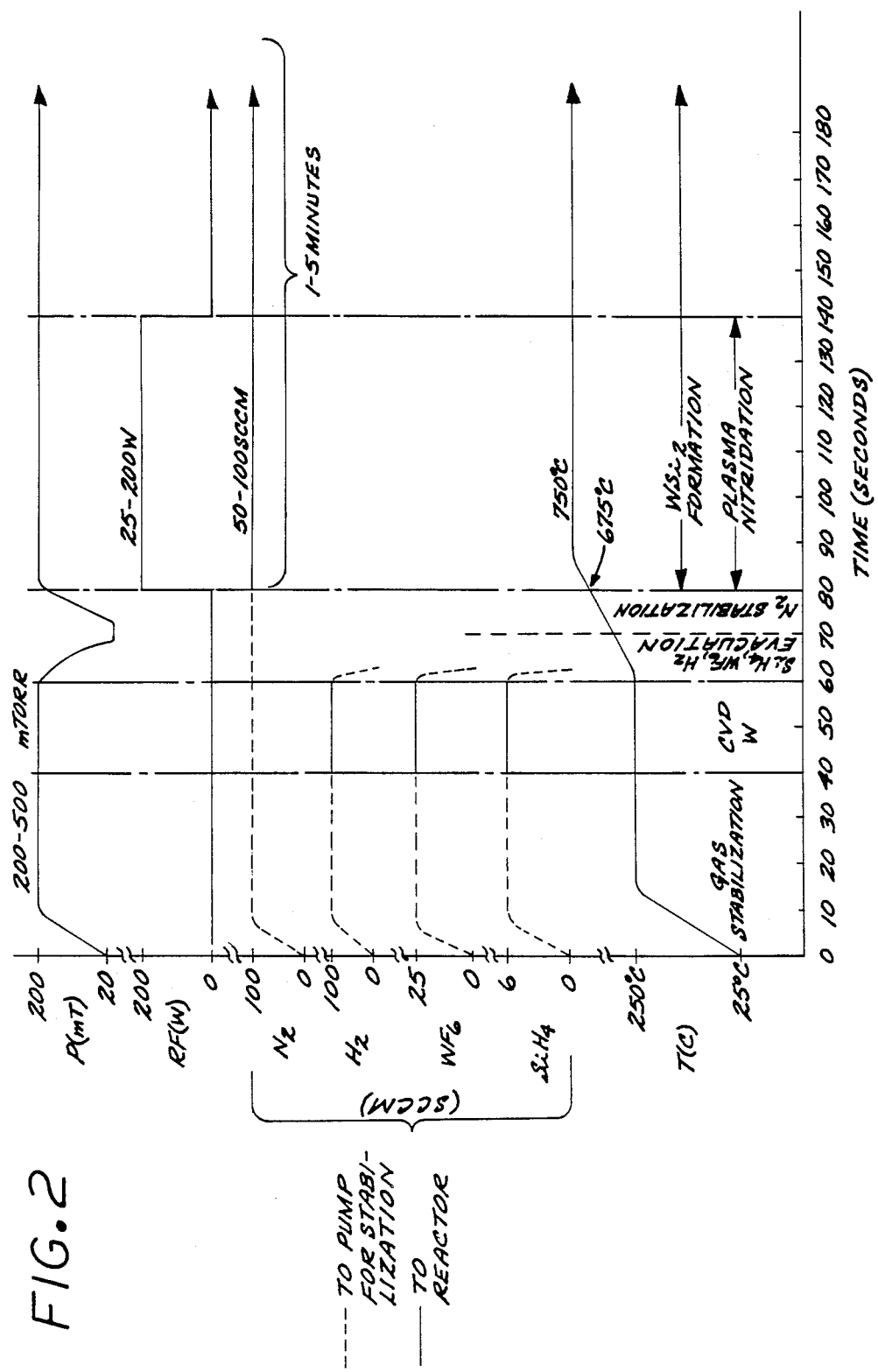
FIG. 2 is a process flow diagram illustrating a typical process for carrying out the invention.

Referring to FIG. 1B, and also to FIG. 2 which illustrates a typical process for carrying out the invention, the integrated circuit wafer illustrated in FIG. 1A is cleaned, for example, in a hydrogen fluoride (HF) solution, and then placed in a cold wall, low pressure chemical vapor deposition reactor for the chemical vapor deposition of a tungsten layer 25 on the exposed surfaces of the source and drain regions 13, 15 and the polysilicon gate 21. Specifically, tungsten is chemically vapor deposited by introducing tungsten hexafluoride ($WF_6$) gas, silane ($SiH_4$), and hydrogen ($H_2$) under the following conditions:

$WF_6$: 25 sccm
SiH4: 6 sccm
$H_2$: 100 sccm
Pressure: 200–500 mTorr
Temp: 250°–350° C.
Time: 20–60 sec.

where sccm represents Standard Cubic Centimeter per Minute.

The amount of time utilized will depend on the desired thickness, and a processing time of about 20 seconds with the foregoing parameters provides a thickness of approximately 500 Angstroms.

The foregoing chemical vapor deposition of tungsten is self-aligned and does not require masking since tungsten selectively deposits on silicon and polysilicon, but not on oxide. Substantially no silicon is reduced in the vertical direction (called silicon consumption) or in the lateral direction (called lateral encroachment), which is believed to be the result of utilizing silane in the vapor deposition process.

Figure 1C:
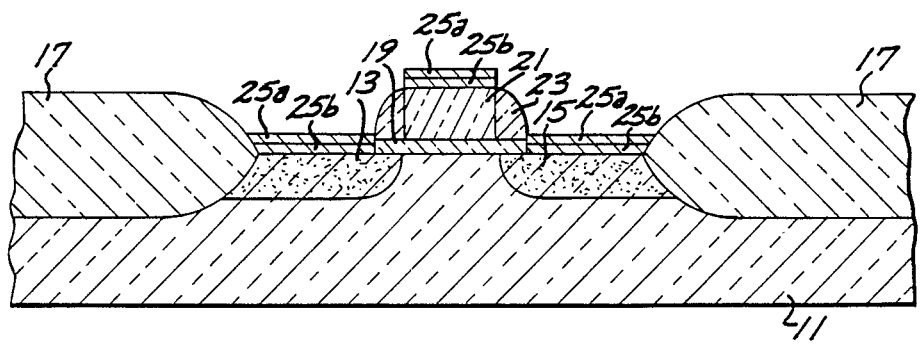

Referring now to FIG. 1C, the deposited tungsten layer 25 is transformed into stacked tungsten nitride and tungsten silicide layers 25a, 25b in the same reactor utilized for the chemical vapor deposition of the tungsten layer 25.

Referring further to FIG. 2, after the requisite tungsten deposition time has elapsed, the flow of gases into the reactor chamber is stopped, and concurrently (1) the reactor chamber is evacuated and (2) the radiant heater is controlled to increase the chamber temperature, as indicated by the lowermost curve of FIG. 2. When the reactor pressure reaches about 20 mTorr, which for example might be about 10 seconds after the start of evacuation, nitrogen (N$_2$) is introduced at a rate of about 50-100 sccm, while the radiant heater continues to increase the temperature. At about 20 seconds after the start of evacuation, at a chamber pressure of about 200 mTorr and a temperature of about 675° C., RF power is provided at about 25-200 watts to subject the wafer 10 to plasma for nitridation. The elevated temperature at or above about 675° C. also causes the formation of tungsten silicide for the tungsten silicide layer 25b. The plasma is generated for about 1-3 minutes, during which the temperature is maintained at about 750° C. After the RF power is turned off, the temperature is maintained at about 750° C. for an additional annealing time period, which continues and completes the formation of the tungsten silicide layer 25b.

The additional annealing time period will depend on the thickness of the tungsten layer 25, as well as the temperature utilized. A thicker tungsten layer requires more time, as does the use of a lower temperature. Typically, the time period from the start of the plasma nitridation to the end of the annealing process will be in the range of 1-5 minutes.

Alternatively, the continued annealing after plasma nitridation can be achieved in a rapid thermal annealing apparatus which is capable of rapidly increasing the operating temperature. For example, annealing can be achieved with a time of about 30 seconds, including the time for increasing the temperature to about 1000°-1200° C.

As a further alternative, the integrated circuit wafer 10 can be removed from the reactor after plasma nitridation, and then placed in a furnace for about 30 minutes, including time for increasing the temperature to about 900° C., to complete the formation of the tungsten silicide layer 25b. The longer time period is required since the time necessary to increase the temperature in a furnace is typically longer than that of a reactor or a rapid thermal anneal apparatus.

It should be noted that prior to introduction of the nitrogen gas for nitridation, the reactor chamber could be backfill flushed with argon, but such additional step would increase processing time. Also, the time required for plasma nitridation depends on the desired thickness of the tungsten nitride layer. However, this thickness will not exceed about 500 Angstroms even if the plasma is generated for more than five minutes.

The resulting tungsten nitride layer 25a provides good compatibility with aluminum metallization for reduced resistivity, and provides a good barrier against aluminum spiking and silicon diffusion. The tungsten nitride layer further functions as a barrier to prevent the oxidation of the tungsten disilicide and any remaining tungsten during any subsequent annealing processes.

The tungsten silicide layer 25b provides low contact resistivity, and further provides a stable interface with silicon since with the foregoing process the tungsten silicide formed averages $WSi_{x=2.3}$ when fully annealed.

The foregoing has been a disclosure of a self-aligned process for forming a diffusion barrier on silicon and polysilicon contacts, and such process is advantageously realized in a chemical vapor deposition reactor without removing the integrated circuit wafer in process from such reactor. The disclosed process efficiently avoids the complexities of known techniques and provides for a diffusion barrier having good conductive and barrier characteristics.

Although the foregoing has been a description and illustration of specific embodiments of the invention, various modifications and changes thereto can be made by persons skilled in the art without departing from the scope of the invention as defined by the following claims.

What is claimed is:

1. A process for forming a diffusion barrier on exposed silicon and polysilicon contacts of an integrated circuit wafer, the process comprising the steps of:
   depositing a layer of tungsten on the exposed contact areas; and
   transforming the deposited layer of tungsten to form stacked, laterally co-extensive tungsten nitride and tungsten silicide layers.

2. The process of claim 1 wherein the step of depositing a layer of tungsten includes the step of chemically vapor depositing tungsten.

3. The process of claim 2 wherein the step of chemically vapor depositing tungsten includes the step of applying a gas mixture including silane, hydrogen, and tungsten hexafluoride.

4. The process of claim 3 wherein the step of chemically vapor depositing tungsten is performed at a temperature between 250° C. and 450° C.

5. The process of claim 1 wherein the step of transforming includes the steps of:
   nitridating the layer of tungsten; and
   heat treating the nitridated layer of tungsten.

6. The process of claim 5 wherein the step of nitridation includes the step of plasma nitridation.

7. The process of claim 5 wherein the step of heat treating includes the step of heating above 600° C.

8. A process for forming a diffusion barrier on exposed silicon and polysilicon contacts of an integrated circuit, the process comprising the steps:
   chemically vapor depositing a layer of tungsten in a self-aligned manner on the exposed contact areas in a deposition reactor;
   maintaining the wafer in the deposition reactor; and
   transforming the deposited layer of tungsten to form stacked, laterally co-extensive tungsten nitride and tungsten silicide layers.

9. The process of claim 8 wherein the step of chemically vapor depositing tungsten includes the step of applying a gas mixture including silane, hydrogen, and tungsten hexafluoride.

10. The process of claim 9 wherein the step of chemically vapor depositing tungsten is performed at a temperature between 250° C. and 450° C.

11. The process of claim 8 wherein the step of transforming includes the steps of:
   nitridating the layer of tungsten; and
   heat treating the nitridated layer of tungsten.

12. The process of claim 11 wherein the step of nitridation includes the step of plasma nitridation.

13. The process of claim 11 wherein the step of heat treating includes the step of heating above 600° C.

* * * * *